United States Patent [19]

Rittenbach

[11] 4,453,137
[45] Jun. 5, 1984

[54] SIGNAL PROCESSOR FOR PLURAL FREQUENCY DETECTION AND TRACKING OVER PREDETERMINED RANGE OF FREQUENCIES

[75] Inventor: Otto E. Rittenbach, Neptune, N.J.

[73] Assignee: The United States of America as represented by the Secretary of the Army, Washington, D.C.

[21] Appl. No.: 345,993

[22] Filed: Feb. 5, 1982

[51] Int. Cl.³ .................... H03H 11/04; H03L 7/06
[52] U.S. Cl. ........................................ 331/2; 328/137; 328/167; 331/31; 333/132; 343/5 SA
[58] Field of Search ................. 331/2, 30, 31, 32; 328/137, 138, 165, 167; 307/520, 521, 522, 524; 343/5 SA; 333/110, 126, 127, 129, 132

[56] References Cited

U.S. PATENT DOCUMENTS

| | | | |
|---|---|---|---|
| 2,816,270 | 12/1957 | Lewis | 333/126 |
| 3,327,227 | 6/1967 | Sykes et al. | 328/137 |
| 3,531,722 | 9/1970 | Seibold | 331/30 X |
| 3,675,132 | 7/1972 | Hansen et al. | 331/32 X |
| 4,400,700 | 8/1983 | Rittenbach | 343/7.7 X |

FOREIGN PATENT DOCUMENTS

| | | | |
|---|---|---|---|
| 2292240 | 6/1976 | France | 343/5 SA |
| 656184 | 4/1979 | U.S.S.R. | 328/167 |

OTHER PUBLICATIONS

W. D. Lewis et al., "A Non Reflecting Branching Filter for Microwaves", *Bell Telephone Systems Technical Publications* (vol. 27, pp. 83-95, Jan. 1948 of *Bell System Technical Journal*).

Primary Examiner—Stanley D. Miller
Assistant Examiner—David C. Mis
Attorney, Agent, or Firm—Anthony T. Lane; Jeremiah G. Murray; Edward Goldberg

[57] ABSTRACT

A signal processor circuit including a plurality of similar cascaded stages, each of which is capable of locking onto and tracking a different frequency of a multiple-frequency composite signal applied to the processor. Each of the stages may comprise a frequency locked loop plus a variable frequency stop, wherein the tuning of the variable frequency stop tracks the output of the frequency locked loop. The variable frequency stop circuit passes the non-locked components to the next similar stage which locks onto one of the remaining components.

9 Claims, 5 Drawing Figures

SIGNAL PROCESSOR FOR PLURAL FREQUENCY DETECTION AND TRACKING OVER PREDETERMINED RANGE OF FREQUENCIES

The invention described herein may be manufactured, used, and licensed by or for the Government for governmental purposes without the payment to me of any royalties thereon.

BACKGROUND OF THE INVENTION

The subject of this invention is signal processing circuitry. More particularly this invention comprises a circuit of the type which is capable of tracking or locking onto several different signals of different frequencies which may exist simultaneously in a composite signal applied to the processor. Circuits of this type are useful, for example in analyzing radar echo signals which often comprise numerous target signals of different and varying frequencies mixed with noise. These different signals might be Doppler shifted echo signals representing different targets all of which may be moving at different and changing radial velocities and hence producing correspondingly changing Doppler echo signals. This processor comprises multiple similar stages, each stage being capable of locking onto and tracking one of the frequency components of the composite input signal and passing the remaining portion of the composite signal to succeeding stages, each of which is capable of locking onto one of the remaining frequency components. Each of the stages comprises a frequency locked loop plus some form of tunable trap or frequency stop circuit.

SUMMARY OF THE INVENTION

Each stage of the circuitry may comprise a frequency locked loop in parallel with a variable frequency stop circuit. The frequency locked loop (FLL) locks onto one of the frequencies of the composite input signal and controls the variable frequency stop (VFS) circuit in such a way that the locked frequency is removed from the composite signal as it passes through the VFS circuit. The output of the VFS circuit forms the composite signal input to the next similar stage, which will automatically lock onto one of its remaining frequencies. Each FLL has an output which varies with its locked frequency, for example, a variable dc bias or control voltage which varies as does the locked frequency. These control voltages form the output of the processor.

The circuitry may comprise conventional circuit elements, for example, frequency locked loops wherein a discriminator controls a voltage controlled oscillator combined with a frequency stop or tuned trap which removes the locked frequency from the output of that stage.

In another embodiment, the FLL includes an unconventional type of discriminator which itself includes a frequency stop circuit which is utilized to remove the locked frequency of that stage, thus simplifying the overall circuitry.

It is thus an object of the invention to provide an improved processing circuit capable of simultaneously locking onto and tracking numerous different signals contained in a composite signal which may be noisy.

A further object is to provide a multistage processor circuit in which each cascaded stage can lock onto and track a different one of numerous components of a multifrequency input signal.

These and other objects and advantages of the invention will become apparent from the following detailed description and the drawings.

DETAILED DESCRIPTION OF A PREFERRED EMBODIMENT

Figure 1:
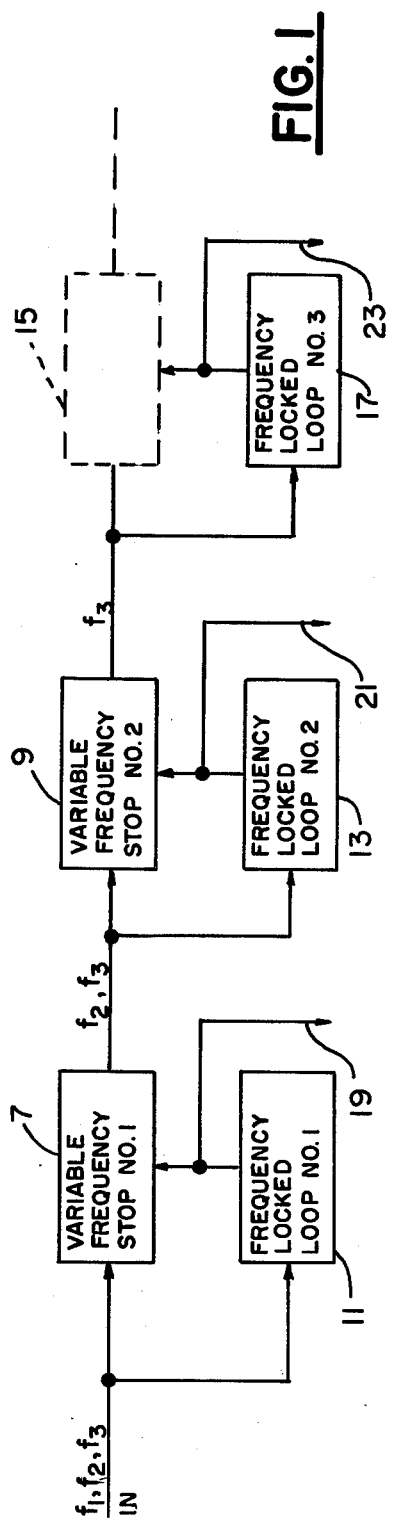
FIG. 1 is a generalized block diagram of the invention.

The diagram of FIG. 1 illustrates the mode of operation of a three stage processor of the present invention. The first stage comprises a first variable frequency stop circuit 7 and a first frequency locked loop 11, to which the composite input signal composed of three frequencies $f_1$, $f_2$, and $f_3$ is applied in parallel. The first frequency locked loop (FLL) 11 will lock onto and track one of the three input signals. The FLL will normally lock onto the most prominent or largest of the input signals which is within its locking range. When locking occurs, subsequent frequency variations of the locked frequency, for example caused by varying radial speeds of a Doppler radar target, will cause the FLL to track the varying frequency so long as the variations do not exceed the locking range of the loop. Most FLLs comprise an oscillator which is free-running in the absence of an applied signal but which locks onto any applied signal within a certain range of its free-running frequency.

The first FLL 11 of FIG. 1 has an output 19 which can be a variable dc bias which follows the locked frequency which is $f_1$ in this example, or the output 19 may be the locked frequency itself, free of noise and all the other frequency components, for example $f_2$ and $f_3$. This FLL output is applied to the first variable frequency stop (VFS) circuit 7. Circuit 7 functions to remove the frequency of the signal onto which loop 11 is locked from the composite input signal, so that the output thereof in the example of FIG. 1 will comprise only $f_2$ and $f_3$. It does this by utilizing the output of FLL 11 in a manner which will become apparent from the remaining figures of the drawings. Thus if the three input frequencies of the composite applied signal are $f_1$, $f_2$, and $f_3$ as shown, and the FLL #1 locks onto and tracks $f_1$, then the first VFS circuit 7 will provide a variable stop or trap for $f_1$ to block its passage to the output of circuit 7. Thus the output of VFS #1 will be only $f_2$ and $f_3$. The second stage of the processor comprises VFS #2 and FLL #2, both of which are connected and function just the same as the corresponding elements of stage one, except that the free-running frequency of stage two is offset somewhat from that of the first stage as well as from the subsequent stages. The center or free-running frequencies of all the stages and the locking ranges can be selected so that they cover either contiguous or overlapping frequency ranges.

The last stage of the three stage circuit of FIG. 1 comprises only the frequency locked loop #3. The FLL

3, 17, locks onto the remaining frequency $f_3$. Since there is no subsequent stage nor any other frequency component, the last stage needs no variable frequency stop circuit, and this missing element is shown as dashed block 15. The leads 21 and 23 represent the outputs of stages two and three respectively. The outputs of the processor are applied to further utilization circuitry where the information therein can be processed further or displayed. However, it may be desirable for standardization purposes to employ similar stages and thus the last stage could include the VFS circuit even though it is not needed or used.

The variable frequency stop circuits of FIG. 1 may comprise electronically tunable resonant trap circuits in which the resonant or trap frequency is caused to vary with the control bias applied thereto from the FLL of that stage. Varactor diodes or reactance tubes would form part of the resonant circuit of the resonant traps and the resonant frequency would be arranged to track the operating frequency of the FLL of that stage.

Figure 2:
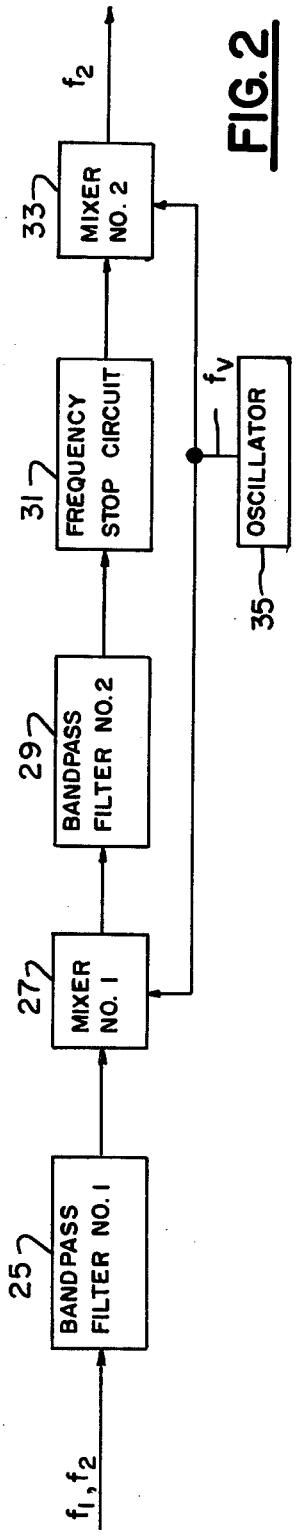
FIG. 2 shows one type of circuit which can be used to remove a single frequency from a composite signal.

FIG. 2 shows one form of a variable frequency stop circuit. In this circuit the bandpass filter 25 is tuned to accept all the frequencies of interest, for example $f_1$ and $f_2$, shown as inputs thereto. These two frequencies are heterodyned with the output $f_\nu$ of oscillator 35 in first mixer 27. The second bandpass filter 29 is tuned to pass the difference frequencies, namely $f_1-f_\nu$ and $f_2-f_\nu$. The frequency stop circuit 31 is tuned to reject one of these two difference frequencies, for example $f_1-f_\nu$ and pass all other frequencies, in this case, $f_2-f_\nu$. The second mixer 33 has as its inputs the oscillator frequency $f_\nu$ and the frequency $f_2-f_\nu$ from circuit 31. It can be seen that one of the heterodyne products of mixer 33 will be $f_2$. Thus this circuit has removed the applied frequency $f_1$ and passed the remaining applied frequency $f_2$. Further, because the input signals are heterodyned down in frequency in the first mixer and then up in frequency in the second mixer, the oscillator frequency $f_\nu$ can vary without affecting the output frequency $f_2$, as long as the frequency stop circuit is not tuned to $f_2-f_\nu$.

Figure 3:
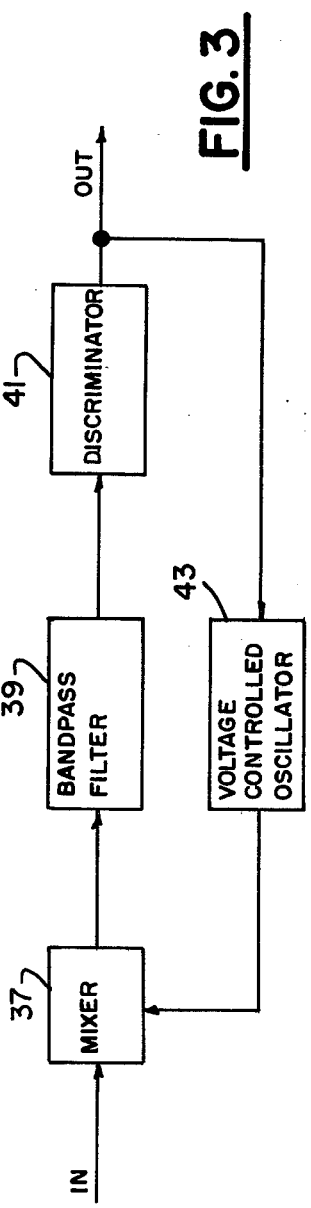
FIG. 3 shows a conventional frequency locked loop.

FIG. 3 is one well known form of a frequency locked loop circuit which can be combined with the circuit of FIG. 2 to form one stage of the circuit of the present invention. In FIG. 3 an input signal to be tracked or locked onto is applied to mixer 37 which has as its second input the output of voltage controlled oscillator (VCO) 43. The bandpass filter 39 selects one of the heterodyne products in the output of the mixer and applies this product to discriminator 41 which has a center frequency the same as filter 39. The discriminator 41 has an output which comprises a dc bias which varies with the frequency applied to it. This bias is applied to the control input of VCO 43 to vary the frequency thereof in such a direction as to maintain the output of filter 39 at or near the center frequency of the discriminator.

Figure 4:
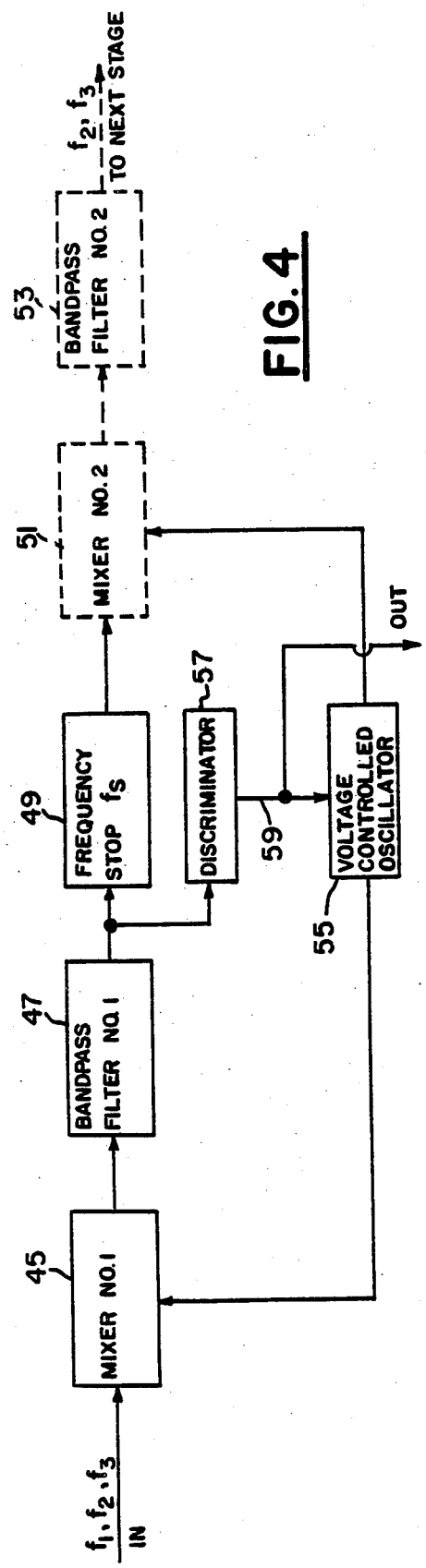
FIG. 4 shows how FIGS. 2 and 3 can be combined to form one stage of the novel circuit of FIG. 1.

In FIG. 4 the oscillator of FIG. 2 has been replaced by the VCO of FIG. 3, with the discriminator 57 controlling the VCO, as in FIG. 3. Thus the circuit of FIG. 4 comprises both a frequency locked loop and a variable frequency stop circuit and thus can function as one stage of the processor. The multi-frequency input signal comprising the three frequencies $f_1$, $f_2$, and $f_3$ is applied to the first mixer 45 where they are heterodyned with the output of voltage controlled oscillator (VCO) 55. The output of mixer #1 is applied to the first bandpass filter 47, the output of which is applied to both the frequency stop circuit 49 and discriminator 57. The output of the frequency stop circuit is applied to second mixer 51 where it is heterodyned in frequency by beating it with the output of VCO 55. The desired beat frequencies in the output of second mixer 51 are selected by bandpass filter 53. The output of discriminator 57 on lead 59 comprises the control voltage for VCO 55 and is also the stage output voltage.

Assume that the processor stage represented by FIG. 4 is designed to lock onto frequencies at or near $f_1$ and pass the other portions of its input to succeeding stages. The frequency stop circuit 49 would then comprise a trap circuit tuned to reject or stop a given frequency band for example around $f_s$, and pass all others. The free-running frequency of VCO 55 would then be chosen as $f_1+f_s$ and the center frequency of discriminator 57 would then be chosen as $f_s$. The first bandpass filter 47 selects the difference frequencies from among the heterodyne products in the output of mixer 45. One of these products will be $f_1-(f_1+f_s)$ or $f_s$ and another will be $f_2-(f_1+f_s)$ and a third will be $f_3-(f_1+f_s)$. It is assumed that all of the input frequencies are within a relatively small frequency range. Thus assuming that $f_1$ happens to be offset from the VCO free-running frequency by $f_s$, the discriminator will be operating at its center frequency and the control voltage applied to the VCO will be zero. Further, the frequency stop circuit will block $f_s$ which represents the frequency $f_1$ after heterodyning with the VCO output. The other heterodyned signals, $f_2-(f_1+f_s)$ and $f_3-(f_1+f_s)$ will not be at the resonant or trap frequency of the stop circuit 49 and will thus be passed to the succeeding circuitry, where they are heterodyned up in frequency by second mixer 51 to their original frequencies, $f_2$ and $f_3$. If the input frequency drifts, the frequency lock loop comprising the VCO 55 and the discriminator 57 and the associated circuitry will operate to track the varying input frequency by varying the VCO frequency in an appropriate manner. The output voltage on lead 59 will vary with the VCO frequency and hence will also follow the variations in the locked input frequency $f_1$. As stated above, each of the stages could be designed to lock onto different frequencies, with the locking range of each stage being at least wide enough so that the entire processor spans a continuous band of frequencies covering the range of expected inputs. As frequencies appear and disappear within this frequency range, the stages will become unlocked and may remain idle or may lock onto another frequency.

Figure 5:
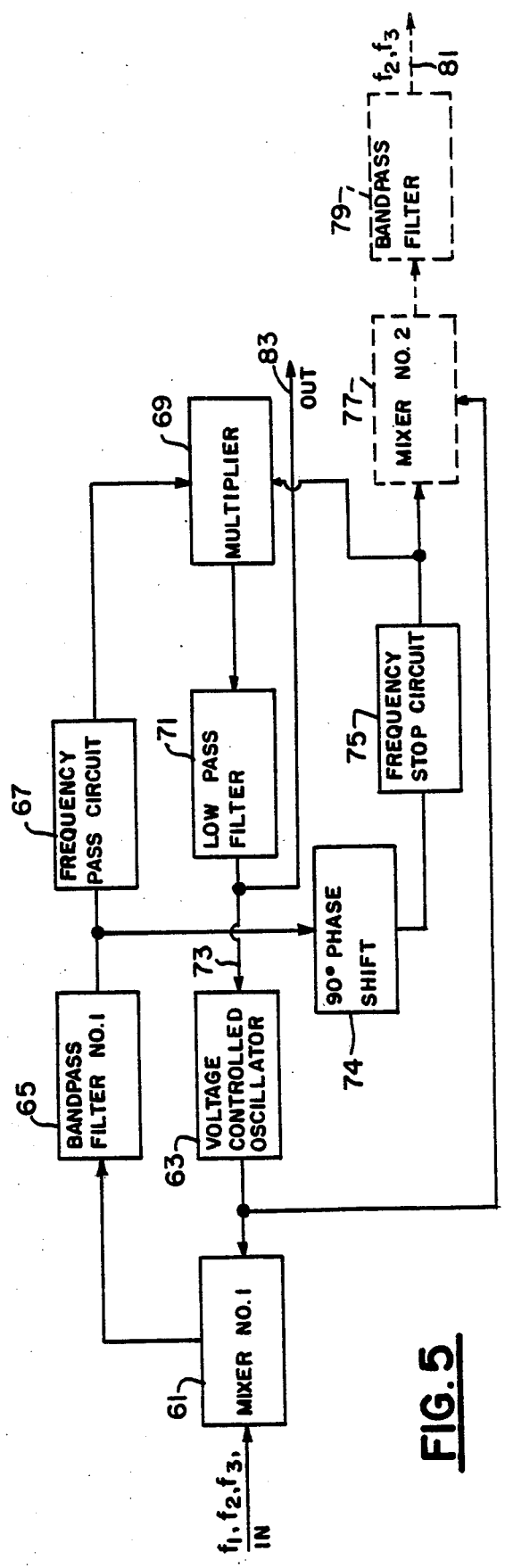
FIG. 5 shows one stage of an alternate embodiment of this invention utilizing an unconventional discriminator.

The circuit of FIG. 5 is an alternate embodiment of a processor stage which includes another type of discriminator. This unconventional discriminator is one which includes a VCO which is part of a feedback loop for frequency tracking of applied signals and in which the applied signals are heterodyned with the VCO output and then split into two quadrature related channels, one of which includes a frequency pass circuit and the other a frequency stop circuit similar to that utilized in the embodiment of FIG. 4 herein. Such discriminators are descrbed and claimed in a co-pending application of the present inventor entitled, DOPPLER SIGNAL PROCESSING CIRCUITRY, Ser. No. 328,962, filed Dec. 9, 1981.

The processor stage of FIG. 5 comprises a discriminator similar to that of FIG. 2 of the aforementioned co-pending application, with some added circuitry to accomplish the desired functions of the present invention. The composite input signal is applied to a first mixer 61 where it is heterodyned with the output of VCO 63. The first bandpass filter 65 selects one of the heterodyne products in the first mixer output. The signal is then split into two channels, the first comprising frequency pass circuit 67 and the second the 90° phase shifter 74 and the frequency stop circuit 75. The outputs of the frequency stop and pass circuits are applied to multiplier 69, the output of which is applied to low pass filter 71. The output of filter 71 is applied to VCO 73 as the control voltage thereof and also forms the output of the stage at lead 83. The circuitry so far described is substantially the same as FIG. 2 of the aforementioned co-pending application. Since this discriminator is of the frequency tracking type which functions as a frequency locked loop, and since it includes the frequency stop circuit 75 which can be utilized as part of the variable frequency stop circuit of the present invention, it can be advantageously adapted for use with the present invention. To this end a second mixer 77 is added with one input comprising the output of frequency stop circuit 75 and the other input the VCO output. The second bandpass filter 79 selects a desired heterodyne product in the output of the second mixer, so that the non-locked frequencies $f_2$ and $f_3$ appear at the lead 81 for application to the next similar stage of the processor. The circuit is so designed that if the first bandpass filter 65 selects the difference frequencies between the input frequencies and the VCO frequency, the second bandpass filter 79 will select the sum frequencies. Also, the tuning of the frequency stop circuit is chosen, in this example, to be equal to the desired locked frequency of $f_1$, as heterodyned by the first mixer and first bandpass filter. Thus the frequency stop circuit would be tuned below $f_1$ by the VCO frequency, as described in connection with FIG. 2. The frequency stop circuit would thus pass the other frequency components to the second mixer where they are heterodyned up in frequency to their original values.

While the invention has been described in connection with specific embodiments, variations therein will occur to those skilled in the art without departing from the spirit of the invention, accordingly the invention should be limited only by the scope of the appended claims.

I claim:

1. A signal processor circuit capable of locking onto and tracking a plurality of frequencies simultaneously, comprising: a plurality of cascaded stages equal to the maximum number of frequencies to be simultaneously processed, means to apply the frequencies to be processed to the first of said stages, all of said stages but the last comprising a frequency locked loop circuit and a variable frequency stop circuit and means to apply respective input frequencies to be processed to said frequency locked loop and variable frequency stop circuits simultaneously and control voltage means connecting said frequency locked loop circuit to said variable frequency stop circuit to vary the timing of said frequency stop circuit so that it tracks the frequency onto which said frequency locked loop is locked whereby said variable frequency stop circuit will remove the locked frequency of that stage from its output and means to apply the output of said variable frequency stop circuit to the next stage of said processor, and wherein said last stage of said processor comprises a frequency locked loop.

2. The circuit of claim 1 wherein each of said frequency locked loops has a different free running frequency.

3. The circuit of claim 1 wherein each of said frequency locked loops comprises an output indicative of the varying frequency onto which said frequency locked loop is locked.

4. A signal processor circuit capable of locking onto and tracking a plurality of frequencies simultaneously, comprising, a plurality of similar cascaded stages, each said stage comprising: a source of input signals of various frequencies, a voltage controlled oscillator, a discriminator, a frequency stop circuit including a tuned trap circuit, means to heterodyne said input signals with the output frequency of said voltage controlled oscillator to obtain the difference frequencies between said voltage controlled oscillator output frequency and said input frequencies, means to apply said difference frequencies simultaneously to said frequency stop tuned trap circuit and to said discriminator, both of which are tuned to the difference frequency onto which that stage is to be locked, said discriminator having an output which provides the stage output and which also is applied to said voltage controlled oscillator as the control voltage thereof, and in which each stage except the last further comprises means to heterodyne the output of said tuned trap with the output frequency of said voltage controlled oscillator to obtain the remaining difference frequencies other than the locked frequency of each said stage for application to succeeding stages.

5. A signal processor capable of locking onto and tracking a plurality of frequencies simultaneously, comprising, a plurality of similar cascaded stages, each stage comprising a voltage controlled oscillator, a frequency stop circuit, a discriminator, a first mixer to which respective stage input frequencies are applied together with the output of said voltage controlled oscillator, a first bandpass filter connected to said first mixer to select the difference frequencies of the heterodyne products thereof, the output of said first bandpass filter connected simultaneously to said frequency stop circuit and said discriminator, both of which are tuned to the desired lock-on frequency of that stage as heterodyned by said first mixer and first bandpass filter, the output of said discriminator being applied to said voltage controlled oscillator as the control voltage thereof and also providing the stage output, and wherein said voltage controlled oscillator has a nominal or free running frequency within the locking range of said desired lock-on frequency of that stage plus the discriminator center frequency, and each of said stages except the last further comprise a second mixer connected to the output of said frequency stop circuit for heterodyning the non-locked signals of that stage with their original frequencies for application to succeeding stages.

6. A signal processor capable of locking onto and tracking a plurality of signals of different frequencies simultaneously, comprising: a plurality of stages each of which comprises a voltage controlled oscillator, a first mixer to which respective stage input frequencies are applied as well as the output of said voltage controlled oscillator, a first bandpass filter connected to said first mixer and tuned to select one of the heterodyne products from the output of said first mixer, a frequency pass circuit, a frequency stop circuit and a 90° phase shifter, the output of said first bandpass filter being connected directly to said frequency pass circuit and via said 90° phase shifter to said frequency stop circuit, said frequency pass and stop circuits being tuned to the respective frequency to which said stage is to be locked as heterodyned by said first mixer, a multiplier connected to the outputs of said frequency pass and stop circuits, the output of said multiplier being applied to the control input of said voltage controlled oscillator, and each of said stages except the last further comprising a second mixer having as its inputs the output of said frequency stop circuit and said voltage controlled oscillator, and a second bandpass filter connected to the output of said second mixer whereby the non-locked signals are obtained from the output of said second bandpass filter for application to the succeeding stage of said processor.

7. A signal processor circuit capable of locking onto and tracking a plurality of frequencies simultaneously, comprising: a plurality of similar cascaded stages, each stage being capable of locking onto and tracking one of said plurality of frequencies and passing on all of the remaining non-locked frequencies to the succeeding stage, each said stage including a frequency locked loop circuit for tracking said one stage frequency and each stage except the last including a variable frequency stop circuit for eliminating said one stage frequency from said plurality of frequencies.

8. A signal processor circuit capable of locking onto and tracking a plurality of frequencies simultaneously, comprising: a plurality of cascaded stages equal to the maximum number of frequencies to be simultaneously processed, means to apply the frequencies to be processed to the first of said stages, all of said stages comprising a frequency locked loop circuit and a variable frequency stop circuit and means to apply respective input frequencies to be processed to said frequency locked loop and variable frequency stop circuits simultaneously and control voltage means connecting said frequency locked loop circuit to said variable frequency stop circuit to vary the tuning of said frequency stop circuit so that it tracks the frequency onto which said frequency locked loop is locked whereby said variable frequency stop circuit will remove the locked frequency of that stage from its output and means to apply the output of said variable frequency stop circuit to the next stage of said processor.

9. The signal processor circuit of claim 7 wherein the last stage includes a variable frequency stop circuit.

* * * * *